(12) United States Patent
Lee

(10) Patent No.: US 6,388,911 B1
(45) Date of Patent: May 14, 2002

(54) BANK SELECT STRUCTURE LAYOUT OF READ ONLY MEMORY WITHOUT THE JUNCTION LEAKAGE

(75) Inventor: Wen-Chieh Lee, Hsinchu (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/880,908

(22) Filed: Jun. 15, 2001

(30) Foreign Application Priority Data

Mar. 29, 2001 (CN) .......................................... 090107569

(51) Int. Cl.$^7$ .............................................. G11C 17/00
(52) U.S. Cl. .................. 365/104; 365/185.11; 365/182; 365/104; 257/390; 257/314; 438/128
(58) Field of Search .......................... 365/104, 63, 182, 365/185.11; 257/390, 314; 438/128

(56) References Cited

U.S. PATENT DOCUMENTS 5,379,254 A * 1/1995 Chang ........................ 365/185
5,590,068 A * 12/1996 Bergemont ................... 365/63
5,933,735 A * 8/1999 Wen ............................ 438/275

* cited by examiner

Primary Examiner—David Nelms
Assistant Examiner—Tu-Tu Ho

(57) ABSTRACT

The present invention provides a ROM having a plurality of memory cell blocks each composed of a main bit line, a ground bit line, and a plurality of memory cells for storing information, which comprises: a plurality of up select transistors for selecting a memory cell block connected to the main bit line from a plurality of the memory cell blocks; and a plurality of down select transistors for selecting a memory cell block connected to the ground line from a plurality of the memory cell blocks, said up select transistors and down select transistors being arranged alternately with the memory cell block in between, wherein the layout pattern of said up select transistors and down select transistors being rotated 90 degrees. Under this kind of new layout pattern, the main bit lines and the ground bit lines will not be affected by the performing of ion implantation process, therefore, the junction leakage current will not be increased.

10 Claims, 3 Drawing Sheets

BANK SELECT STRUCTURE LAYOUT OF READ ONLY MEMORY WITHOUT THE JUNCTION LEAKAGE

FIELD OF THE INVENTION

This invention relates to semiconductor integrated circuits and more particularly to a bank select structure layout of a high density read only memory circuit.

BACKGROUND OF THE INVENTION

Read-only memory (ROM) is a nonvolatile semiconductor memory widely used in computer and microprocessor systems for permanently storing information including programs and data that will be repeatedly used. ROM manufacturing involves very complicated and time-consuming processes and require costly equipment and material. Therefore, the data that is to be permanently stored in ROM's are first defined by the customer and then furnished to the factory to be programmed into the ROM.

Most ROM are identical in semiconductor structure except for the different values of data stored therein. Therefore, the ROM devices can be fabricated up to the stage ready for data programming and then the semi-finished products are stocked in inventories waiting for customer orders. The customer then furnishes the data to the factory where the data is stored into the semi-finished ROM by using, the commonly called mask programming process. This procedure is presently a standard method in the semiconductor industry for fabricating ROM.

Conventional ROM are usually based on metal-oxide semiconductor field-effect transistor (MOSFET) memory cells, each memory cell is used for the storage of one value of the binary-coded data, "0" or "1". In the mask programming process, these MOSFET-based memory cells are selectively doped with impurities into the associated channel regions to change the threshold voltage. Supposing a memory cell is in a permanently-ON state when applying a 5v voltage on it represents the permanent storage of the binary-coded data, for example "0", and the memory cells is a permanently-OFF state represents the permanent storage of the binary-coded data, for example 1.

FIG. 1 shows a circuit configuration layout pattern of a memory cell array of a mask ROM. In FIG. 1, the vertical bit lines 101 are formed by an N conductive type buried diffusion layer, and the horizontal word lines 102 are formed by a polycide. The bit lines 101 and the word lines 102 are arranged to intersect each other. The memory cell transistors 103 are formed in such a way that the source and drain regions are formed at the intersecting portions, and the channels are formed between the intersecting portions. The memory cell transistors 103 are coded by an impurity diffusion technique into the channels. Each memory cell transistor 103 is formed to be turned on or off on the basis of a predetermined gate voltage according to whether an information bit is to be held by the cell.

In the memory cell array shown in FIG. 1, the bank select 104, 105 are also shown, wherein the bank select 104 is up bank select and the bank select 105 is down bank select. Each bank select is composed of 2 select bit lines 106, 107 and 108, 109. The up select bit lines 106 and 107 and buried bit lines and main bit lines 115, 116 and 117 are arranged to intersect each other. The up select transistors 110 and 112 are formed in such a way that the source and drain regions are formed at the intersecting portions, and the channels are formed between the intersecting portions. The down select bit lines 108 and 109 and buried bit lines and ground bit lines 118 and 119, they are arranged to intersect each other. The down select transistors 113 and 114 are formed in such a way that the source and drain regions are formed at the intersecting portions, and the channels are formed between the intersecting portions. When reading the data stored in memory cell 103, a high voltage is applied to the up select bit line 106 and down select bit line 108 to open the up select transistor 110 and down select transistor 113. Therefore, there is a formed current path starting from the main bit line 116 to pass through the up select transistor 110, the buried bit line 120, the memory cell 103, the buried bit line 121 and the down select transistor 113, and then to reach the ground bit line 119 connected to the ground to finish the reading data work.

One major drawback to the foregoing ROM device, however, is that the code-implantation process requires a threshold voltage change and code-implantation process is also performed on the up bank select and the down bank select so as to close these select transistors not being used during operation. Referring to FIG. 1, the block diagram 130 to 137 in the figure is the code-implantation region for raising the threshold voltage of the select transistor in the region. Typically, the substrate of conventional ROM is P type and the buried bit lines, main bit lines and ground bit lines are N type. Then, the P type impurity is used as the ion source to implant the impurity to diffuse into the channels. The overlapping situation usually happens during the implantation process, which will cause the source and drain's concentration decrease of these select transistors performed implantation process. Under this condition, the junction leakage current will increase. Some of the main bit lines and ground bit lines also overlaps during the performing implantation process in this kind of structure layout pattern, and if the voltage is applied on the main bit line, the junction leakage current will also increase and cause an overlap.

SUMMARY OF THE INVENTION

With these foregoing structure layout pattern problems, it is the objective of the present invention to provide a new ROM structure layout pattern design. Under the new layout pattern design, the main bit lines and the ground bit lines may not overlap during the performed implantation process. The main bit lines and the ground bit lines may not be affected by the performed implanting process, therefore, the junction leakage current will not be increased.

To achieve the above-mentioned objective, the present invention provides a ROM having a plurality of memory cell blocks, each composed of a main bit line, a ground bit line, and a plurality of memory cells for storing information, which comprises: a plurality of up select transistors for selecting a memory cell block connected to the main bit line from a memory cell block plurality; and a plurality of down select transistors for selecting a memory cell block connected to the ground line from a plurality of the memory cell blocks, said up select transistors and down select transistors being arranged alternately with the memory cell block in between, wherein the layout pattern of said up select transistors and down select transistors has been rotated 90 degrees. Under this kind of new layout pattern, the main bit lines and the ground bit lines will not be affected by the process of ion implantation process, therefore, the junction leakage current will not be increased.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings, wherein.

DETAILED DESCRIPTION OF THE PREFERRED EMBODIMENT

Without limiting the present invention's spirit and scope, the method proposed in the present invention is an illustration with one preferred embodiment about a new kind of layout pattern design of read only memory. People who are knowledgeable about the embodiments, can apply the new layout pattern on any kind of read only memory to eliminate the possibility of the main bit lines and the ground bit lines being affected during the ion implantation process, therefore, the junction leakage current can be decreased. The usage of the present invention it not limited by the embodiment as follows.

Figure 1:
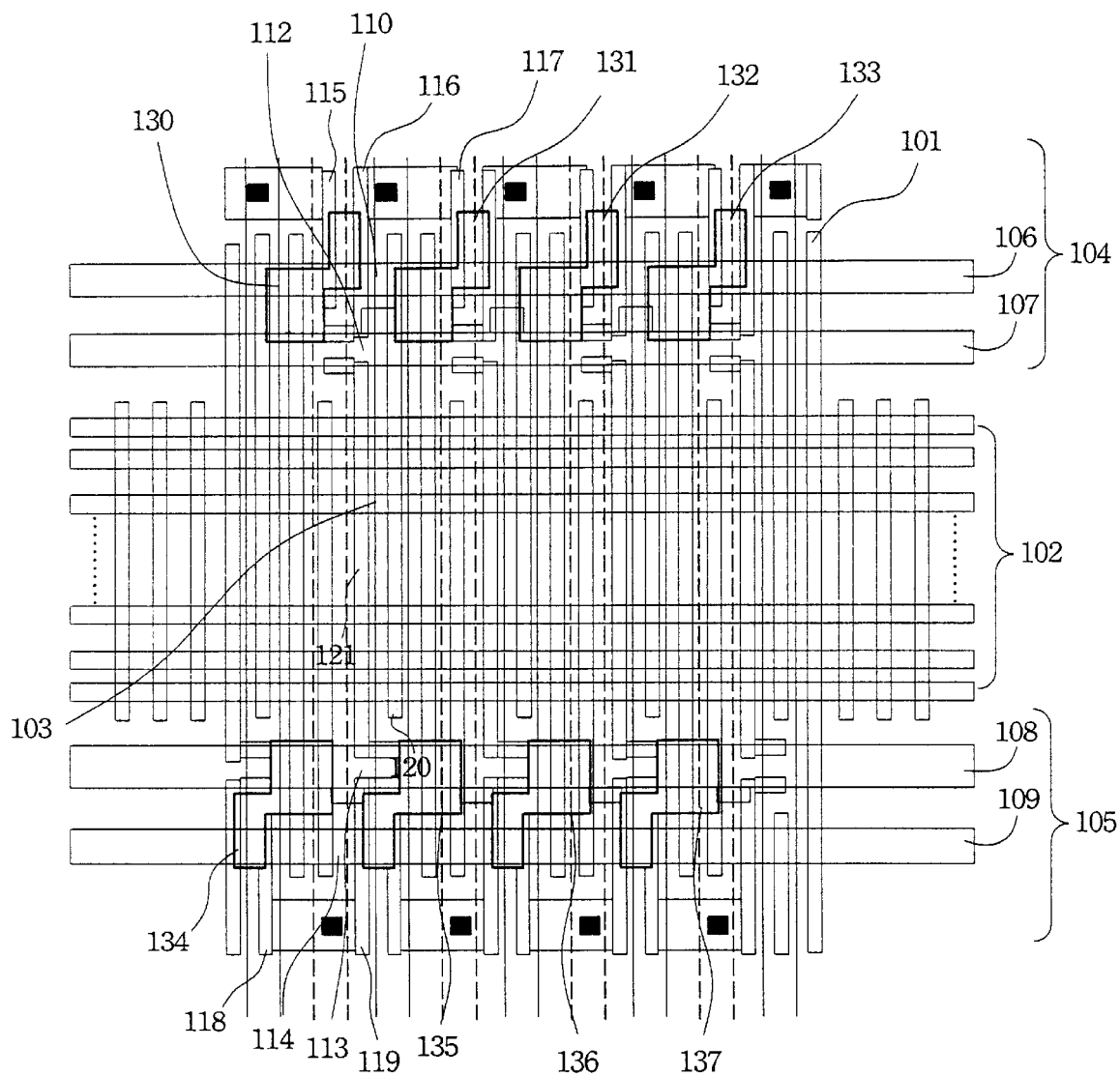
FIG. 1 is a schematic top view of the layout pattern of a prior art.
Figure 2:
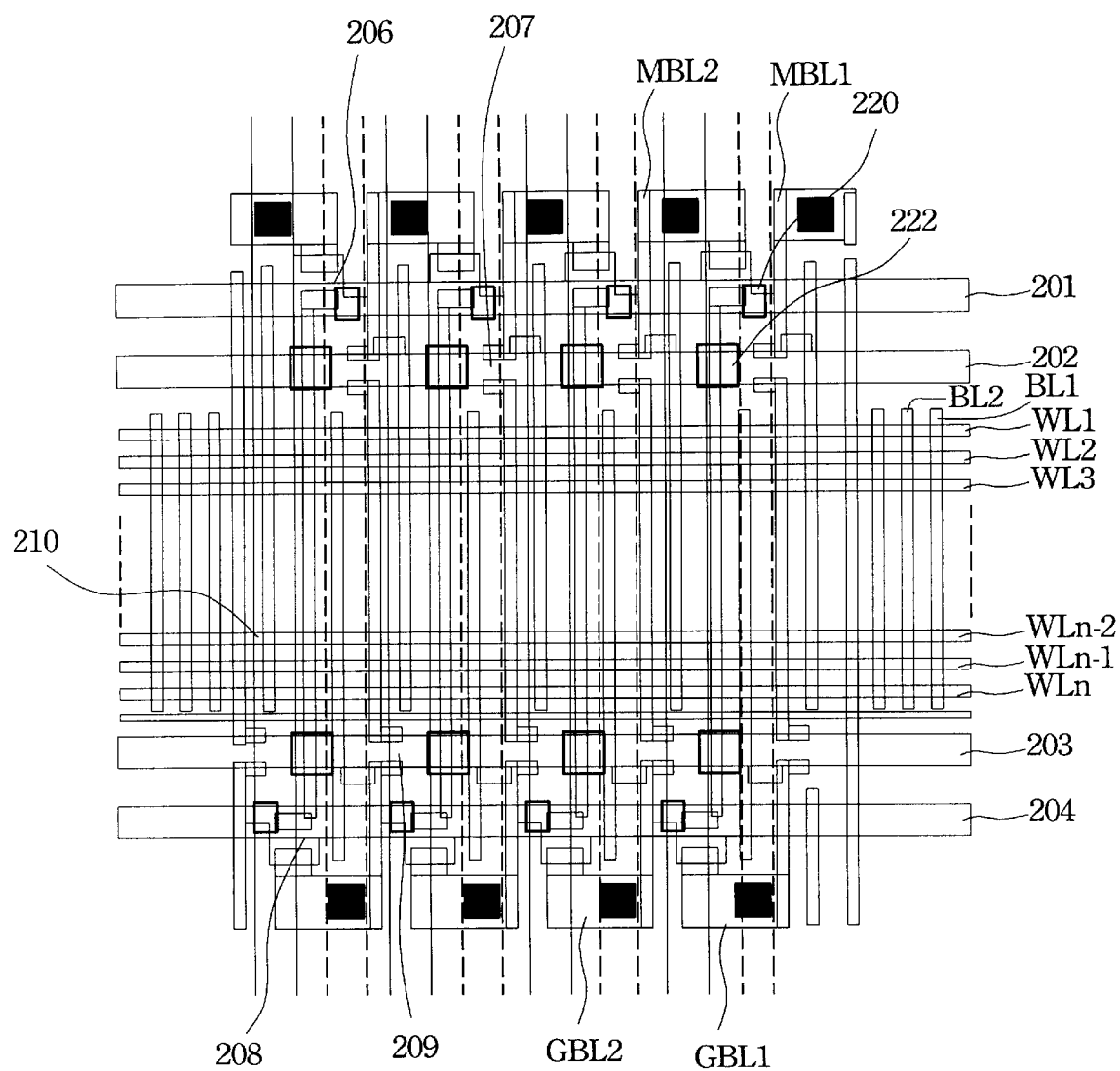
FIG. 2 is a schematic top view of the layout pattern of the present invention.

Referring to FIG. 2, it is an embodiment of the present invention. FIG. 2 is a ROM cells array's small portion circuit diagram comprising a plurality of bit lines, a plurality of word lines, a plurality of main bit lines, a plurality of ground bit lines, two up select bit lines and two down select bit lines.

The portion of the ROM memory cell array shown in FIG. 2 comprises several parallel (vertically disposed) buried N+ bit lines BL1–BLn (BLn not shown in the figure), several (horizontally disposed) polysilicon word lines WL1 to WLn are laid perpendicular to the buried N+ bit lines BL1–BLn. This ROM memory cell array stores data by coding them with code implantation into the channel, wherein the ROM memory cell transistors are formed in such a way that the source and drain regions are formed at the intersecting portions of the buried N+ bit lines and the word lines, and the channels are formed between the intersection portions. Every memory cell transistor may store the binary-coded data "0" or "1". In the programming process, these MOSFET memory cells are selectively doped with impurities into the associated channel regions to change the threshold voltage. Supposing a memory cell is in a permanently-ON state when 5 Volts are applied, it represents the permanent storage of the binary-coded data, for example "0", and the memory cells are in a permanently-OFF state, this represents the permanent storage of the binary-coded data, for example 1. The ROM cell array is read by raising one word line to a voltage which is preferably less than or equal to 5 Volts, and sensing the bit line current to determine the "1" value or the "0" value.

There are buried N+ main bit lines labeled as MBL1–MBLn (MBLn not shown in the figure) parallel to the some up extending bit lines. The two up select bit lines 201 and 202 are formed by polycide and there are a plurality of up select transistors formed therein, wherein the up select transistor 206 whose gate is connected to the up select bit line 201 and the up select transistor 207 whose gate is connected to the up select bit line 202. The intersecting portion between the buried N+ main bit lines and the up select bit lines forms the drain of the up select bit lines and the intersecting portion between the buried N+ bit lines and the up select bit lines forms the source of the up select bit lines, wherein the channels are formed between the intersection portions.

There are buried N+ ground bit lines labeled as GBL1–GBLn (GBLn not shown in the figure) parallel to the some down extending bit lines. The two down select bit lines 203 and 204 are formed by polycide and there are a plurality of down select transistors formed therein, wherein the down select transistor 208 whose gate is connected to the down select bit line 204 and the down select transistor 209 whose gate is connected to the down select bit line 203. The intersecting portion between the buried N+ ground bit lines and the down select bit lines forms the drain of the down select bit lines and the intersection portion between the buried N+ bit lines and the down select bit lines forms the source of the down select bit lines, wherein the channels are formed between the intersection portions. If the memory cell transistor 210 is selected, the signal from the main bit lines can couple into the buried N+ bit lines through the conduction of up select transistor, then, couple into the ground N+ bit lines through the conduction of down select transistor to read out the stored data.

Referring to FIG. 2, the block diagram 220 and 222 in the figure is the code-implantation region for raising the threshold voltage. Typically, the substrate of conventional ROM is P type and the buried bit lines, main bit lines and ground bit lines are N type. Then, the P type impurity is used as the ion source to implant into the channels of the select transistors. Because of the threshold voltage being raised, the select transistor is in a permanently-OFF state. The most different point, according to the circuit layout pattern of the present invention, is that the implantation impurity will not overlap the main bit lines and ground bit lines during the implantation process. Therefore, the concentration of the source and drain of these select transistors may not be affected. The junction leakage current will not be increased.

Figure 3:
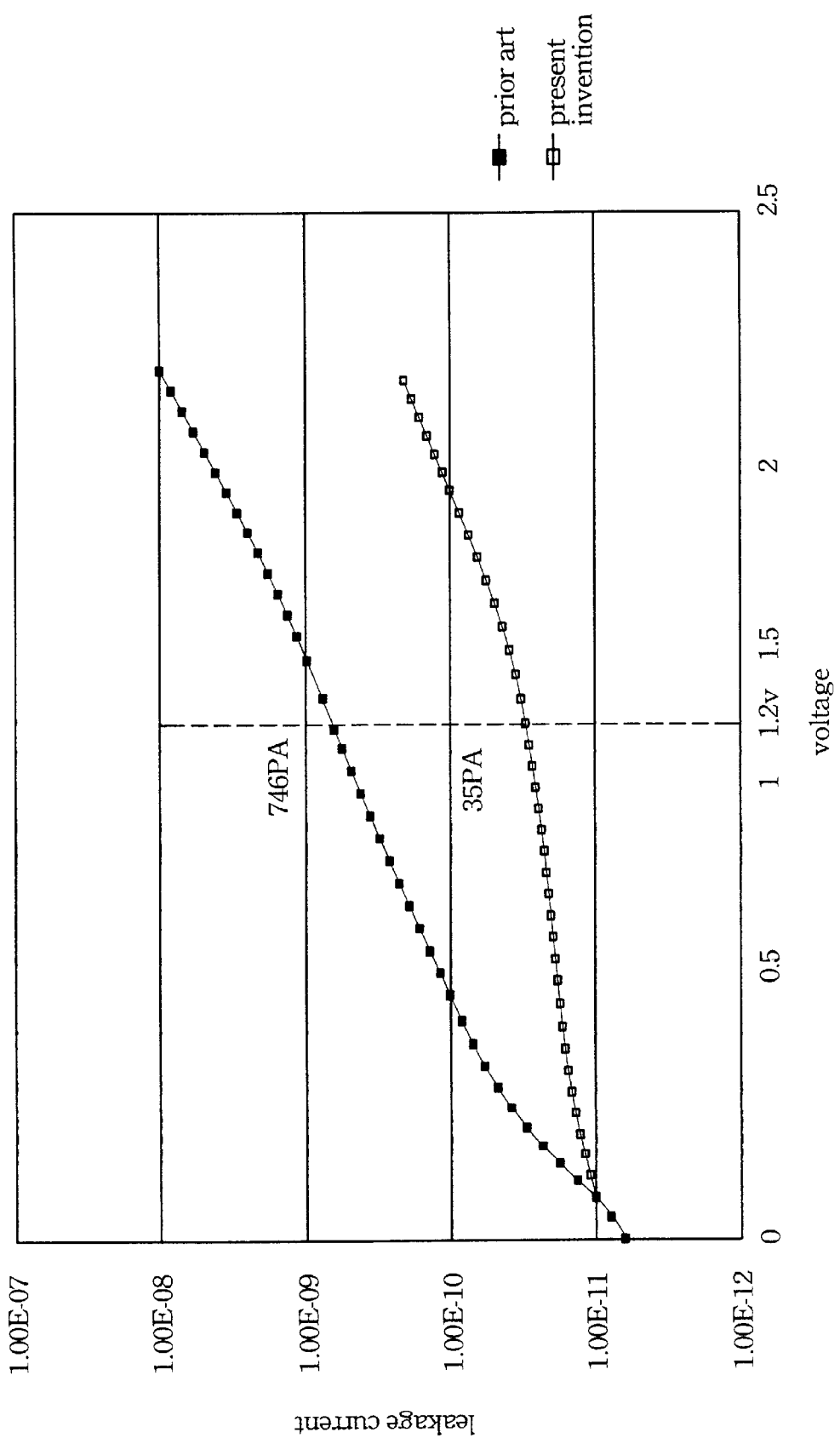
FIG. 3 is a comparison diagram of the junction leakage current.

Referring to FIG. 3, it is a comparison diagram of the junction leakage current. Using the operational 1.2 volts, the junction leakage current according to the circuit layout pattern of the present invention is 35 Pico-Ampere. The junction leakage current according to the circuit layout pattern of the prior art is 746 Pico-Ampere, which is 20 times comparing with the present invention. Therefore, the junction leakage current may be decreased by the new circuit layout pattern.

As is understood by a person skilled in the art, the foregoing descriptions of the preferred embodiment of the present invention is an illustration of the present invention rather than a limitation thereon. Still more configurations and variations could be implemented by persons skilled in the art. It is intended to cover various modifications and similar arrangements included within the true scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A semiconductor read only memory including a plurality of units, each of the plurality of units comprising:
   four vertically disposed buried bit lines located in parallel to each other and being formed in the substrate, and named first, second, third and fourth respectively;
   a plurality of horizontally disposed word lines located in parallel to each other and intersecting said four vertically disposed buried bit lines;
   a memory cell transistors array, located at intersections between said plurality of word lines and said four buried bit lines to form a memory cell matrix, wherein the intersections are the source and drain of the memory cell transistors and the channels are formed between the intersection portions, and a gate of each of said memory cell transistors is connected to one corresponding word line of said plurality of word lines;

a buried main bit line having two ends being formed in said substrate, wherein between the first end of said buried main bit line and the first end of said second buried bit line is the first interval and between the second end of said buried main bit line and the first end of said fourth buried bit line is the second interval;

a buried ground bit line having two ends being form in said substrate, wherein between the first end of said buried ground bit line and the second end of said fourth buried bit line is the third interval and between the second end of said buried ground bit line and the second end of the second buried bit line of the next unit is the fourth interval;

two horizontally disposed up select bit lines located in parallel to each other, named first and second respectively, and said first up select bit line crosses said first interval, said third buried bit line and said buried main bit line, wherein the intersection portion of said first up select bit line and said first end of said buried main bit line and the intersection portion of said first up select bit line and said first end of said second buried bit line respectively forms the source and drain of select transistor and said first interval is the channel, on the other hand, said second up select bit line crosses said second interval and said second and third buried bit line, wherein the intersection portion of said second up select bit line and said second end of said buried main bit line and the intersection portion of said second up select bit line and said first end of said fourth buried bit line respectively forms the source and drain of select transistor and said second interval is the channel; and two horizontally disposed down select bit lines located in parallel to each other, named first and second respectively, and said first down select bit line crosses said third interval, and the first and third buried bit line of the next unit, wherein the intersection portion of said first down select bit line and said first end of said buried ground bit line and the intersection portion of said first down select bit line and said second end of said fourth buried bit line of said next unit respectively forms the source and drain of select transistor and said third interval is the channel, on the other hand, said second down select bit line crosses said buried ground bit line and the first buried bit line and the fourth interval of the next unit, wherein the intersection portion of said second down select bit line and said second end of said buried ground bit line and the intersection portion of said second down select bit line and said second end of said second buried bit line of said next unit respectively forms the source and drain of select transistor and said fourth interval is the channel.

2. The semiconductor read only memory of claim 1, wherein said semiconductor substrate is P-type.

3. The semiconductor read only memory of claim 1, wherein said semiconductor substrate is N-type.

4. The semiconductor read only memory of claim 1, wherein said buried bit lines, main bit lines and ground bit lines are formed by N+ buried diffusion layer.

5. The semiconductor read only memory of claim 1, wherein said buried bit lines, main bit lines and ground bit lines are formed by P+ buried diffusion layer.

6. The semiconductor read only memory of claim 1, wherein said up select bit lines and down select bit line being arranged alternately with the memory cell block in between.

7. The semiconductor read only memory of claim 1, wherein said select transistors and memory cell transistors are flat structure.

8. The semiconductor read only memory of claim 1, wherein said up select bit line and down select bit line determine the memory cell column address and a plurality of said word lines determine the memory cell row address.

9. The semiconductor read only memory of claim 1, wherein said binary data stored in said memory cell transistors is determined by an implantation process to vary the threshold of memory cell transistors.

10. The semiconductor read only memory of claim 1, wherein said a plurality word lines, up select bit lines and down select bit lines comprises polysilicon.

* * * * *